United States Patent [19]

Shibata

[11] Patent Number: 5,258,329
[45] Date of Patent: Nov. 2, 1993

[54] METHOD FOR MANUFACTURING A MULTI-LAYERED INTERCONNECTION STRUCTURE FOR A SEMICONDUCTOR IC STRUCTURE

[75] Inventor: Hideki Shibata, Yokohama, Japan

[73] Assignee: Kabushiki Kaisha Toshiba, Kawasaki, Japan

[21] Appl. No.: 831,915

[22] Filed: Feb. 6, 1992

[30] Foreign Application Priority Data

Feb. 7, 1991 [JP] Japan .................................. 3-16585

[51] Int. Cl.⁵ .......................................... H01L 21/441
[52] U.S. Cl. ..................................... 437/195; 437/194
[58] Field of Search .............................. 437/195, 194; 148/DIG. 42, DIG. 83

[56] References Cited

U.S. PATENT DOCUMENTS

4,265,935  5/1981  Hall ..................................... 437/194
5,063,175  11/1991  Broadbent ..................... 437/195 X

Primary Examiner—John S. Maples
Attorney, Agent, or Firm—Finnegan, Henderson, Farabow, Garrett & Dunner

[57] ABSTRACT

A semiconductor integrated circuit device and its manufacturing method are disclosed, the method comprising the steps of forming, over a semiconductor substrate, a first interconnection layer which involves a step-like surface, forming, over a first interconnection layer, an insulating layer and planarizing the surface of the second insulating layer, providing a plurality of via holes of different depths in the insulating layer reaching the first interconnection layer, subsequent to the step, implanting an impurity ion in the first interconnection layer such that an electronegativity in the first interconnection layer varies in accordance with the depths of the via holes, depositing a metal film in the via holes, and forming a second interconnection layer over the insulating layer so as to be connected to the first interconnection layer by the deposited metal film in the via holes.

9 Claims, 5 Drawing Sheets

METHOD FOR MANUFACTURING A MULTI-LAYERED INTERCONNECTION STRUCTURE FOR A SEMICONDUCTOR IC STRUCTURE

BACKGROUND OF THE INVENTION

1. Field of the Invention

The present invention relates to a semiconductor IC device having a multi-layered structure and its manufacturing method and, in particular, a metal interconnection layer structure for positively connecting a first metal interconnection layer to a second metal interconnection layer (an upper layer) by a high melting point metal layer selectively deposited in via holes in an insulating interlayer between these two layers and its manufacturing method.

2. Description of the Related Art

Figure 8:
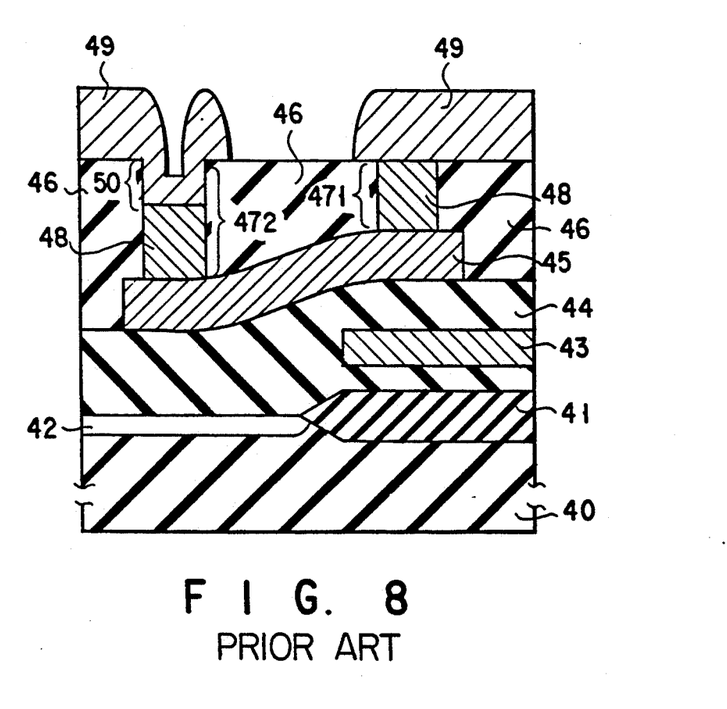
FIG. 8 is a cross-sectional view showing a metal interconnection layer to which the present invention is not applied.

In the case where, in a semiconductor IC structure, a high melting point metal film, such as tungsten (W), is selectively grown in via holes so that a first metal interconnection layer is connected to an overlying second metal interconnection layer, those via holes of different depths exist on a pattern layout. That is, as shown in FIG. 8, as a first metal interconnection layer 45 is formed over a first insulating interlayer 44 in a manner to straddle between a given conductive film (for example, a polysilicon interconnection film) 43 formed over a field insulating film 41 overlying a semiconductor substrate 40 and a diffusion area 42 formed in the surface portion of a semiconductor substrate, a step-like surface occurs on the first metal interconnection layer 45 caused by a corresponding step-like underlying layer, that is, caused by the conductive film 43 and diffusion area of different levels. In the case where a second insulating interlayer 46 is formed over the first metal interconnection layer 45 overlying the step-like lower layer and then the upper surface of the resultant structure is planarized, via holes are provided in the second insulating interlayer 46 over a high level area of the first metal interconnection layer 45 corresponding to a contact formation area and a low level area of the first metal interconnection layer 45 corresponding to another contact formation area, that is, relatively shallow and relatively deep via holes 471 and 472 are provided in the second insulating interlayer 46.

After the via holes of different depths have been formed in the second insulating interlayer 46 to reach the first metal interconnection layer, for example, a tungsten (W) film 48 is selectively grown (deposited) by a CVD method in those via holes in the second insulating interlayer 46. At this time, the tungsten film 48 is grown with the shallow level via hole 471 normally as a reference so that it is completely filled in the via hole.

Since, according to the existing method, the vapor phase rate of growth is constant relative to all the via holes, even if the shallow via hole 471 is completely filled with a material layer, a short material supply occurs in the deep via hole 472 due to the formation of the step-like underlying layer, leaving an empty air gap 50 in the second insulating interlayer. Let it be assumed that the step is, for example, about 1.0 μm deep and that the size of the opening of the relatively deep via hole 472 is about 1.0 μm. Then the empty air gap 50 left in the via hole has an aspect ratio of about 1.

When, as shown in FIG. 8, a metal film is sputtered onto the second insulating interlayer 46 and patterned to provide a second metal interconnection layer 49, the metal layer is connected to the tungsten film 48 with which the relatively shallow via hole 471 is completely buried. A poor coverage occurs on the metal film at an area corresponding to the empty air gap left in the relatively deep via hole 472 and a connection failure occurs between the first and second metal interconnection layers, presenting a reliability problem.

In the existing method for forming the metal interconnection layer for a semiconductor IC device, if a high melting point film is selectively grown in those via holes of different depths in the insulating interlayer at those areas reaching the first metal interconnection layer, an empty air gap is left in the relatively deep via hole and, when a metal film is sputtered over the insulating interlayer so as to provide a second metal interconnection layer, a poor coverage occurs on the metal layer surface at an area corresponding to the empty air gap, causing a failure connection between the first and second metal interconnection layers. This presents a reliability problem.

SUMMARY OF THE INVENTION

It is accordingly the object of the present invention to provide a semiconductor integrated circuit device capable of positively connecting an underlying interconnecting layer to an outer, overlying interconnecting layer by a high melting point metal film properly and selectively deposited in those via holes of different depths provided in an insulating interlayer between these two interconnection layers, and a method for manufacturing the same.

In one aspect of the present invention there is provided a method for manufacturing a semiconductor integrated circuit device comprising the steps of:

(1) forming a first interconnection layer over a semiconductor substrate;

(2) forming, over a first interconnection layer, an insulating layer and planarizing the surface of the second insulating layer;

(3) providing a plurality of via holes of different depths in the insulating layer reaching the surface of the first interconnection layer;

(4) subsequent to the step (3), implanting an impurity ion in the first interconnection layer such that an electronegativity in the first interconnection layer varies in accordance with the depths of the via holes;

(5) depositing a metal film in the via hole; and (6) forming a second interconnection layer over the insulating layer so as to be connected to the first interconnection layer by the deposited metal film in the via hole.

In another aspect of the present invention, there is provided a semiconductor integrated circuit device comprising a semiconductor substrate; a first interconnection layer provided over the semiconductor substrate and having a step-like surface, the first interconnection layer being so provided that a plurality of via holes of different depths in a insulating layer reaches the surface of the first interconnection layer; a metal layer filled in each of the via holes; and a second interconnection layer formed over the metal layer and insulating layer, wherein the first interconnection layer has an ion implanted layer at an area corresponding to at least a relatively shallow one of the plurality of via holes.

Figure 4:
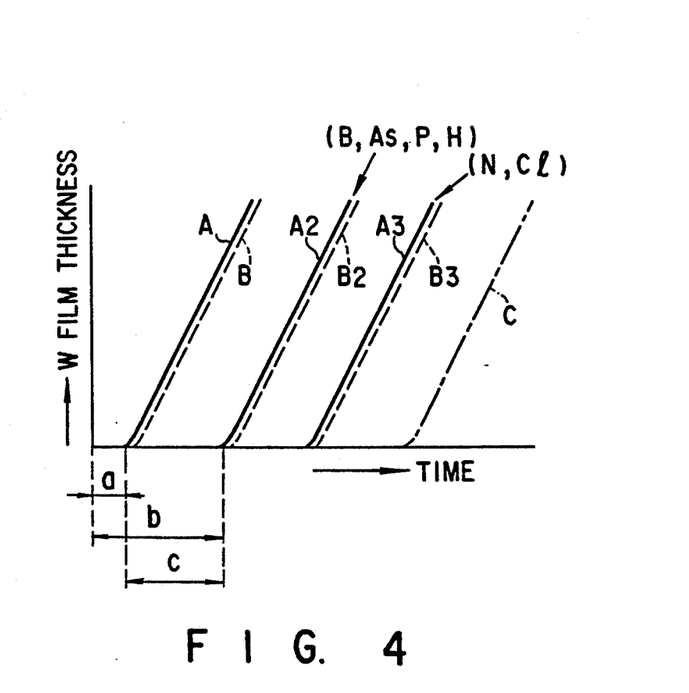
FIG. 4 is a graph showing a reaction, to induction time, of the growth of a W film over an Al layer, etc. based on a discovery made by the inventor.

The present invention utilizes the characteristic of an induction time involved from the supply of a feed gas to the start of growth of a metal film (for example a W film) upon the growth of a high melting point metal layer as a deposited layer in the via holes. The inventor has discovered a phenomenon that the induction time becomes longer, the smaller the difference $\Delta Em$ of the electronegativity En in the metal interconnection layer as seen from fluorine. In this connection it is to be noted that En denotes a sum of the electron affinity and ionization energy. FIG. 4 shows this aspect of the present invention.

That is, in order to adjust an amount of growth of the metal layer in the relatively shallow via hole in distinct to that in the relatively deep via hole, an ion layer is formed only at that area of the first interconnection layer corresponding to the relatively shallow via hole. By so doing, the start (b in FIG. 4) of growth of the metal film in the relatively shallow via hole is delayed behind that (a in FIG. 4) at the relatively deep via hole by a predetermined period (c) of time. It takes a relatively long time to grow the metal film as a deposited layer into the relatively shallow via hole. This method ensures a better connection of the first interconnection layer to the second interconnection layer through the metal layer in the respective via holes without leaving any air gap relative to the via holes which would otherwise be encountered in the existing method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

The embodiment of the present invention will be explained below with respect to the accompanying drawings.

Figure 1:
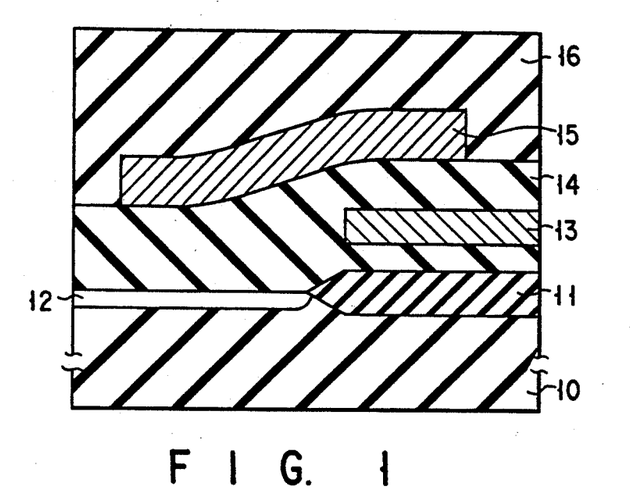
FIGS. 1 to 3 are cross-sectional views showing the steps of forming a metal interconnection layer structure according to a first embodiment of the present invention.
Figure 2:
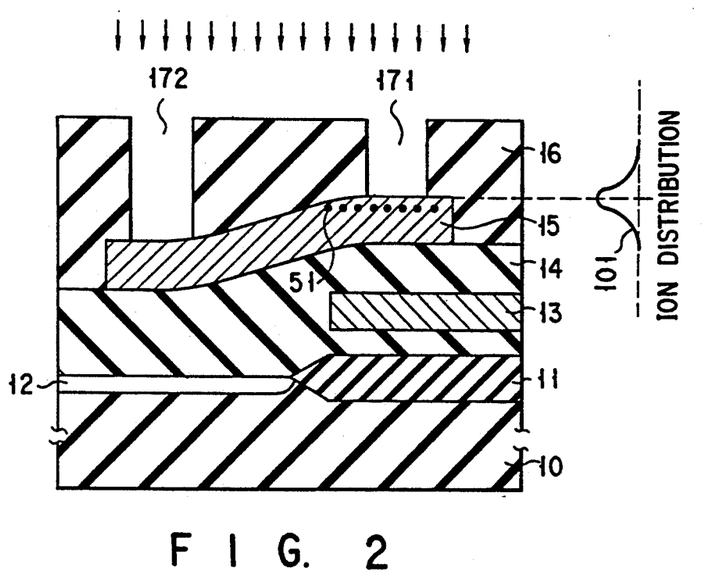
Figure 3:
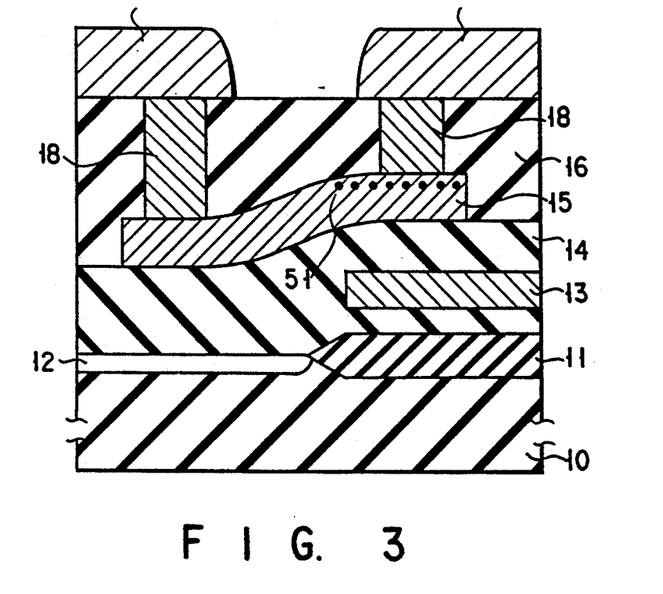

FIGS. 1 to 3 show the steps of a process for manufacturing a metal interconnection layer structure according to a first embodiment of the present invention. As shown in FIG. 1, a field oxide film 11 and a gate insulating film, not shown, are formed over a semiconductor substrate, such as a silicon substrate 10, followed by the formation of a gate interconnection layer (gate electrode) 13 of an insulated gate type field effect transistors (MOS FET) and formation of an impurity diffusion layer (for a source and drain) 12 in the surface portion of the silicon substrate. Then a CVD oxide film ($SiO_2$ film) and a boron.phosphorus silicate glass (BPSG) film are deposited as a first insulating interlayer (a stacking layer) of, for example, 1.0 $\mu$m over the surface of the silicon substrate. The resultant semiconductor structure is heat treated at 800° to 850° C. and thus the surface of the structure is planarized. In the case where the gate interconnection layer 13 is situated over the field oxide film 11 at an area near the impurity diffusion layer 12, a somewhat step-like gradient is present on the surface of the insulating interlayer 14 at an area extending in a direction from the field oxide film 11 toward the impurity diffusion layer 12 even after the surface of the first insulating interlayer 14 has been planarized. Then an Al.Si(1%).Ou(0.5%) type aluminum alloy layer, for example, is sputtered, as a first metal interconnection layer of, for example, 0.8 $\mu$m, over the surface of the semiconductor structure, followed by a patterning step. By so doing, the first metal interconnection layer is provided in a manner to straddle over the step-like gradient. Then a second insulating interlayer (here a $SiO_2$ layer) 16 is deposited, by a low-temperature plasma CVD method for instance, over the surface of the semiconductor structure and the surface of the structure is fully planarized through an etchback process.

By the use of both a photoetching process (PEP) and reactive ion etching (RIE) process, as shown in FIG. 2, via holes 171 and 172 of different depths are provided in the second insulating interlayer 1 at those contact formation areas through which the first metal interconnection layer 15 in the second insulating interlayer 16 is connected to an overlying second metal interconnection layer 19 in which case their depths are, for example 0.8 $\mu$m and 1.4 $\mu$m, respectively. In actual practice, via holes 171 and 172 are provided in the second insulating interlayer 16 at areas corresponding to contact formation areas of those high and low portions of the first metal interconnection layer 15. Then the ion implantation of an impurity ion is achieved so as to vary the electronegativity, En, in the surface of the first metal interconnection layer 15 in accordance with the depth of the via hole. In a practical example, a born (B), arsenic (As), phosphours (P) or hydrogen (H) is ion implanted, at a dose of $1 \times 10^{16}$ to $1 \times 10^{17}$ cm$^{-2}$ and acceleration voltage of 40 KeV, at an area (ion-implanted area) corresponding to a relatively shallow via hole 171 reaching the surface of the first metal interconnection layer 15, noting that, in the previous example, this is done at a dose of $1 \times 10^{16}$ cm$^{-2}$ and acceleration voltage of 40 KeV. By so doing, the electronegativity, En, in the ion-implanted area is made greater than that in an area corresponding to the relatively deep via hole 172 reaching the surface of the first metal interconnection layer 15, that is, in an area where the ion is not implanted. In this case it is known that the electronegativity, En, in an Al layer is about 1.5. In the present embodiment, the electronegativity, En, of about 2.0 is achieved, by the ion implantation method, in the area corresponding to the relatively shallow via hole 171 reaching the surface of the first metal interconnection layer 15. Then a high melting point metal film (here a W film) 18 is selectively grown by a CVD method using a metal fluoride (for example, $WF_6/SiH_4$ gas) as a feed gas so that it is deposited, as a buried layer, in the respective via hole over the surface of the first metal interconnection layer 15.

Here it is known that En is a F layer is about 3.98. In the embodiment, upon being viewed from F, $\Delta$ En (=3.98−2.0=about 2.0) of En in the area corresponding to the relatively shallow via hole 171 over the first metal interconnection layer 15 is made smaller than $\Delta$ En (=3.98−1.5=about 2.5) of En in the area corresponding to the relatively deep via hole 172 over the first metal interconnection layer.

In FIG. 2, reference numeral 51 denotes an ion implanted layer and 101 denotes an ion distribution graphically shown at a dose of $1 \times 10^{16}$ $cm^2$ and acceleration voltage of 40 KeV. From this it will be seen that the ion-implanted layer 51 is formed only at an area of the first metal interconnection layer 15 which corresponds to the shallow via hole 171 at an area near 0.8 $\mu$m deep. Since the ion distribution is determined by the dose and acceleration voltage involved, the manufacture can form that ion-implanted layer 51 at a requisite area by setting a proper dose and acceleration voltage. By so doing, the via holes of different depths can be filled with the electronegativity in Al set at the electronegativity of the ion-implanted layer and, with a proper metal growth start time so set, can be so filed without leaving any air gap.

The inventor has discovered a phenomenon that as indicated by the growth characteristic A and A2 in FIG. 4, the growth rate (GR) of the W film is constant irrespective of $\Delta$ En of En as seen from the fluorine (F) and that the induction time (a, b) involved from the supply of the feed gas to the start of the growth becomes greater, the smaller the difference $\Delta$ En.

In FIG. 4, A shows the case where a metal film 18 is grown over the Al interconnection layer 15 and A2 shows the case where a metal film 18 is grown over that metal interconnection layer where any of B, As, P or H is ion implanted. At that time, a denotes an induction time for the case of A and is about 10 seconds by way of example and b denotes an induction time for the case of B and is about 30 seconds by way of example.

Taking the embodiment of FIG. 2 by way of example, the induction time is about 30 seconds because En in the ion-implanted layer 51 is involved at the area of the metal interconnection layer 15 corresponding to the relatively shallow via hole 171, whereas the induction time is about 10 seconds because En in Al alone is involved at the metal interconnection layer 15 corresponding to the relatively deep via hole 172. Since, in this case, the sputtering time for metal film growth is about 60 seconds, it follows that the substantive times for metal film growth are 60−30=30 seconds and 60−10=50 seconds. About 20 seconds more time is given for growth relative to the relatively deep via hole 172. From this it will be seen that the via holes of different depths are filled with the metal film without leaving any air gap.

An Al alloy film is sputtered, as an Al alloy layer about 1.0 $\mu$m thick for instance, on the surface of the semiconductor structure and a patterning step is done through the use of the PEP and RIE method to provide a second metal interconnection layer 19. By so doing, the second metal interconnection layer makes positive contact with the W film (layer) 18 so that it is firmly connected to the first metal interconnection layer 15 via the W layer 18.

A semiconductor integrated circuit device thus fabricated comprises the first metal interconnection layer 15 formed over the first insulating interlayer (insulating layer) 14 overlying the semiconductor substrate and having a step surface; the second insulating interlayer (insulating layer) 16 formed over the first metal interconnection layer and having a planarized surface; the W layers 18 of different depths selectively grown in the via holes (here two via holes 171 and 172) in the second insulating layer and making contact with the surface of the first metal interconnection layer; and the second metal interconnection layer 19 provided over the resultant structure and connected to the first metal interconnection layer via the W layers 18.

Figure 9:
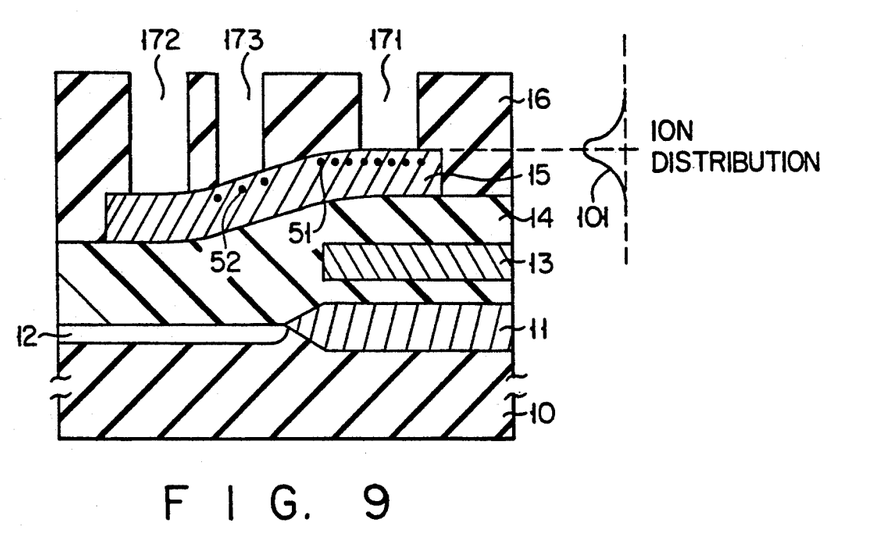
FIG. 9 is a cross-sectional view showing a step of manufacturing a metal interconnection layer structure according to a third embodiment of the present invention.

The feature of the metal interconnection layers lies in that the first metal interconnection layer has an ion implanted layer 51 in a surface portion corresponding to the relatively shallow via hole 171 and no ion implanted layer in the remaining surface portion corresponding to the relatively deep via hole 172. As shown in FIG. 9, even if another via hole 173 is provided in the second insulating layer at those areas situated between the relatively shallow and deep via hoes 171 and 172, such an ion implanted layer 52 can be formed in dependence upon its depth to obtain a similar effect.

FIG. 4 shows other growth characteristics A2, B, B and C in comparison with the growth characteristics A and A2. Here the growth characteristic A2 is an example where nitrogen (N) or chlorine (Cl) ion is implanted in the aluminum layer and a W film is grown on the ion implanted aluminum layer by the CVD method using a metal fluoride (for example, $WF_6/SH_4$ gas) as a feed gas. It is known that En in a titanium (Ti) layer is about 1.6 close to a value of En in an aluminum (Al) layer. The growth characteristic B shows the case where a W film is grown on a Ti layer by a CVD method using metal fluoride (for example, $WF_6/SiH_4$ gas). The growth characteristic B2 shows the case where B, As, P or H is ion implanted into a Ti layer and a W film is grown by a CVD method using a metal fluoride (for example, $WF_6/SiH_2$ gas) as a feed gas. The growth characteristic B3 shows the case where N or Cl is ion implanted in a Ti layer and a W film is grown on the Ti ion implanted layer by a DVD method using a metal fluoride (for example, $WF_6/SiH_4$ gas) as a feed gas. It is known that En of $SiO_2$ is about 1.8 to 1.9. The growth characteristic C is the case where a W film is grown on an $SiO_2$ by a CVD method using a metal fluoride (for example, $WF_6/SiH_4$) as a feed gas.

Figure 5:
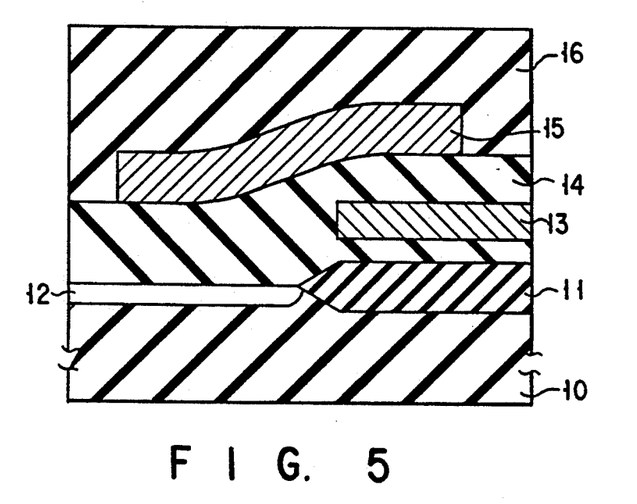
FIGS. 5 to 7 are cross-sectional views showing the steps of manufacturing a metal interconnection layer structure according to a second embodiment of the present invention.
Figure 6:
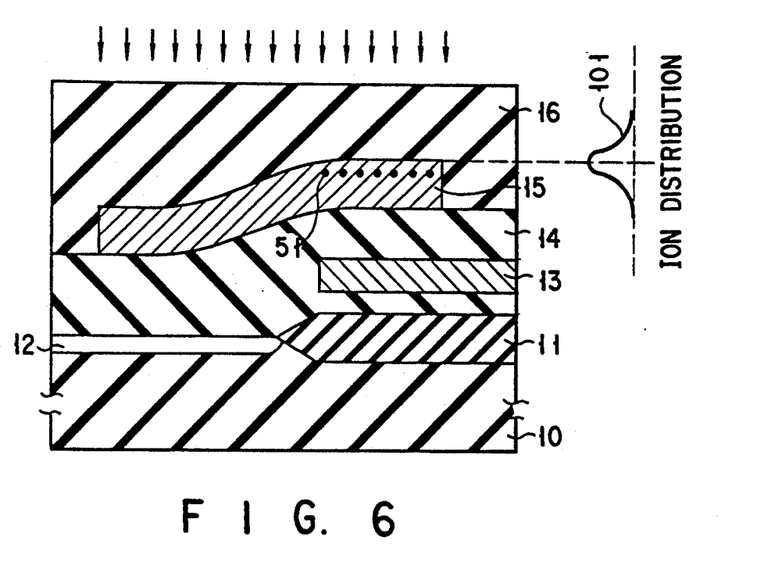
Figure 7:
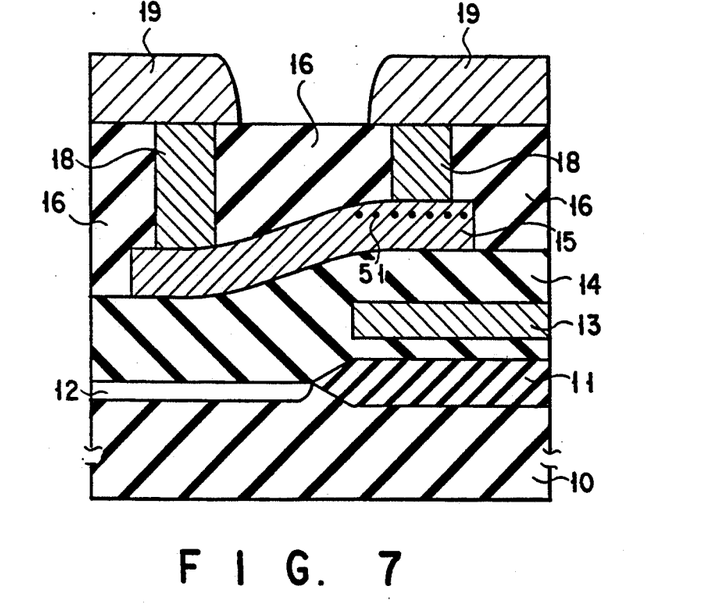

FIGS. 5 to 7 show one example of forming a metal interconnection layer structure according to a second embodiment of the present invention. This method is different from the previous method in that an impurity ion is implanted before via holes are provided in a second insulating interlayer 16 and that the conditions of their ion implanting steps are different from each other.

As shown in FIG. 5, a field oxide film 11 and gate insulating film (not shown) are formed over a semiconductor substrate 10 as in the pervious embodiment of FIG. 1, followed by the formation of a gate interconnection layer 13 and an impurity diffusion layer 12 for source and drain regions for MOSFET. A first insulating interlayer 14 is deposited over the resultant structure to provide a planarized surface. A first metal interconnection layer 15 of an aluminum alloy is provided over a step-like surface of the first insulating interlayer 14 and a second insulating interlayer 16 is deposited on the semiconductor structure to provide a fully planarized surface.

As shown in FIG. 6, an impurity ion, such as B, As, P or H, is so implanted as to vary, in a later step, En in the surface of the first metal interconnection layer 15 in dependence upon the depth of via holes in the second insulating interlayer 16. Stated in more detail, a dose level and acceleration voltage are so set in the ion implantation step as to enable a mean range in the gaussian distribution of an amount of ion implanted to be brought to the surface layer portion of the first metal interconnection layer 15 corresponding to a relatively shallow one 171 of those via holes 171 and 172 provided in the second insulating interlayer 16 at a later step. In this case it is to be noted that the dose level and acceleration voltage in the ion implanting step are set to be, for example, $1 \times 10^{16}$ to $1 \times 10^{17}$ cm$^{-2}$ and 100 to 300 KeV, respectively. By a CVD method using a metal fluoride (for example, WF$_6$/SiH$_4$ gas) as a feed gas, a high melting point metal (here a W film) 18 is selectively grown, as shown in FIG. 7, to allow it to be deposited on that bottom of the respective via hole defined by the surface of the first metal interconnection layer 15.

Then an aluminum alloy film 1.0 µm, for example, is sputtered, as a second metal interconnection layer, on the whole surface of the semiconductor structure, followed by a patterning step. The resultant second metal interconnection layer 19 is in contact with the W film 1 in the via hole and hence is connected to the first metal interconnection layer via the W film 18.

This manufacturing process can also obtain substantially the same effect as that of the previous manufacturing process. The feature of the metal interconnection structure thus obtained lies in that, of those surface portions of the first metal interconnection layer defining the bottom surfaces of the two via holes of different depths, the surface portion corresponding to the relatively shallow via hole is greater in impurity concentration than the surface portion corresponding to the relatively deep via hole.

According to the present invention as set out above, the high melting point metal film can be selectively grown in a plurality of via holes of different depths in the second insulating interlayer reaching the surface of the first metal interconnection layer. It is thus possible to fully bury the respective via holes with the high melting point metal film (layer). In this way, a method for manufacturing a semiconductor IC structure ca be achieved in which the first metal interconnection layer ca be connected to the second metal interconnection layer with high reliability.

In another aspect of the present invention, a high melting point metal film can be selectively grown in a plurality of via holes of different depths in the insulating interlayer reaching the surface of the first metal interconnection layer so that the via hole is fully buried with the aforementioned material. By so doing, it is possible to achieve a semiconductor integrated circuit structure in which the second metal interconnection layer can be positively connected to the first metal interconnection layer via the high melting point metal film in the via holes.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents

What is claimed is:

1. A method for manufacturing a semiconductor device, comprising the steps of:
   (1) forming, over a semiconductor substrate, a first interconnection layer including a first surface having a first height and a second surface having a second height;
   (2) forming, over the first interconnection layer, an insulating layer having a planar surface;
   (3) providing a first via hole in the insulating layer in correspondence with said first surface of the first interconnection layer and having a first depth reaching said first surface of the first interconnection layer, and a second via hole in the insulating layer in correspondence with said second surface of the first interconnection layer and having a second depth reaching said second surface of the first interconnection layer;
   (4) implanting an impurity ion into at least the first surface of the first interconnection layer through said first via hole such that an electronegativity of the first surface of the first interconnection layer is changed in accordance with the first depth of the first via hole;
   (5) depositing a metal film so as to fill the first and second via holes; and
   (6) forming a second interconnection layer over the insulating layer so as to be connected to the first interconnection layer via the metal film.

2. A method according to claim 1, wherein the step of providing the first and second via holes further includes the step of providing a third via hole through said insulating layer having a third depth reaching a third surface of the first interconnection layer such that the first depth of the first via hole is less than the second depth of the second via hole and the second depth of the second via hole is less than the third depth of the third via hole.

3. A method according to claim 1 or 2, wherein after the step of implanting the impurity ion, the electronegativity of the first surface of the first interconnection layer is greater than the electronegativity of the second surface of the first interconnection layer.

4. A method according to claim 1, wherein the impurity ion to be implanted contains boron.

5. A method according to claim 1, wherein the impurity ion to be implanted contains arsenic.

6. A method according to claim 1, wherein the impurity ion to be implanted contains phosphorus.

7. A method according to claim 1, wherein the impurity ion to be implanted contains hydrogen.

8. A method according to claim 1, wherein the step (5) is done by a vapor phase growth method.

9. A method for manufacturing a semiconductor device, comprising the steps of:
   (1) forming, over a semiconductor substrate, a first interconnection layer having a first surface having a first height and having a second surface having a second height;
   (2) forming, over said first interconnection layer, an insulating layer having a upper-most planar surface;
   (3) implanting an impurity ion into the first surface of the first interconnection layer through a portion of the upper-most planar surface of the insulating layer in correspondence with the first surface of the first interconnection layer;

(4) providing a a first via hole in the insulating layer in correspondence with the first surface of the first interconnection layer and having a first depth reaching the first surface of the first interconnection layer and a second via hole in the insulating layer in correspondence with the second surface of the first interconnection layer and having a second depth reaching the second surface of the first interconnection layer;

(5) depositing a metal film so as to fill the first and second via holes; and (6) forming a second interconnection layer over the insulating layer so as to be connected to the first interconnection layer by the deposited metal film in the first and second via holes, the insulating layer being formed as an insulating interlayer between the first and second interconnection layers.

* * * * *